United States Patent
Poirier et al.

(10) Patent No.: US 6,265,897 B1
(45) Date of Patent: Jul. 24, 2001

(54) CONTENTION BASED LOGIC GATE DRIVING A LATCH AND DRIVEN BY PULSED CLOCK

(75) Inventors: Christopher Allan Poirier; Samuel D Naffziger; Wayne Dervon Kever, all of Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/466,493

(22) Filed: Dec. 17, 1999

(51) Int. Cl.[7] ............................................. H03K 19/096
(52) U.S. Cl. ........................ 326/93; 326/95; 326/98; 326/113
(58) Field of Search ........................... 326/83, 86, 93, 326/95, 98, 112, 113, 119

(56) References Cited

U.S. PATENT DOCUMENTS

| | | | |
|---|---|---|---|
| 4,700,086 | * | 10/1987 | Ling et al. ........................... 326/25 |
| 4,751,407 | * | 6/1988 | Powell .................................. 327/295 |
| 4,815,041 | * | 3/1989 | Baylock ................................ 365/233 |
| 4,899,066 | * | 2/1990 | Aikawa et al. ........................ 326/98 |
| 5,400,295 | * | 3/1995 | Matsumura et al. ................. 365/233 |
| 5,453,708 | * | 9/1995 | Gupta et al. ........................... 326/98 |
| 5,670,898 | * | 9/1997 | Fang ....................................... 326/93 |
| 5,880,608 | * | 3/1999 | Metha et al. .......................... 326/93 |

FOREIGN PATENT DOCUMENTS 1-232826 * 9/1989 (JP) ........................................ 326/18

OTHER PUBLICATIONS

Rhyne, Fundamentals of Digital System Design, N.J. 1973 pp. 70–71.*

* cited by examiner

Primary Examiner—Michael Tokar
Assistant Examiner—Steven S. Paik

(57) ABSTRACT

A pseudo-NMOS logic gate of an integrated circuit chip is enabled for a time interval that is substantially less than one-half a clock cycle of the integrated circuit. A latch responds to an output signal of the pseudo-NMOS logic gate for a period that is simultaneous with or slightly less than the time while the pseudo-NMOS logic gate is enabled. The latch derives an output signal commensurate with the output signal of the pseudo-NMOS logic gate while the pseudo-NMOS logic gate is enabled, until the next clock cycle occurs.

24 Claims, 2 Drawing Sheets

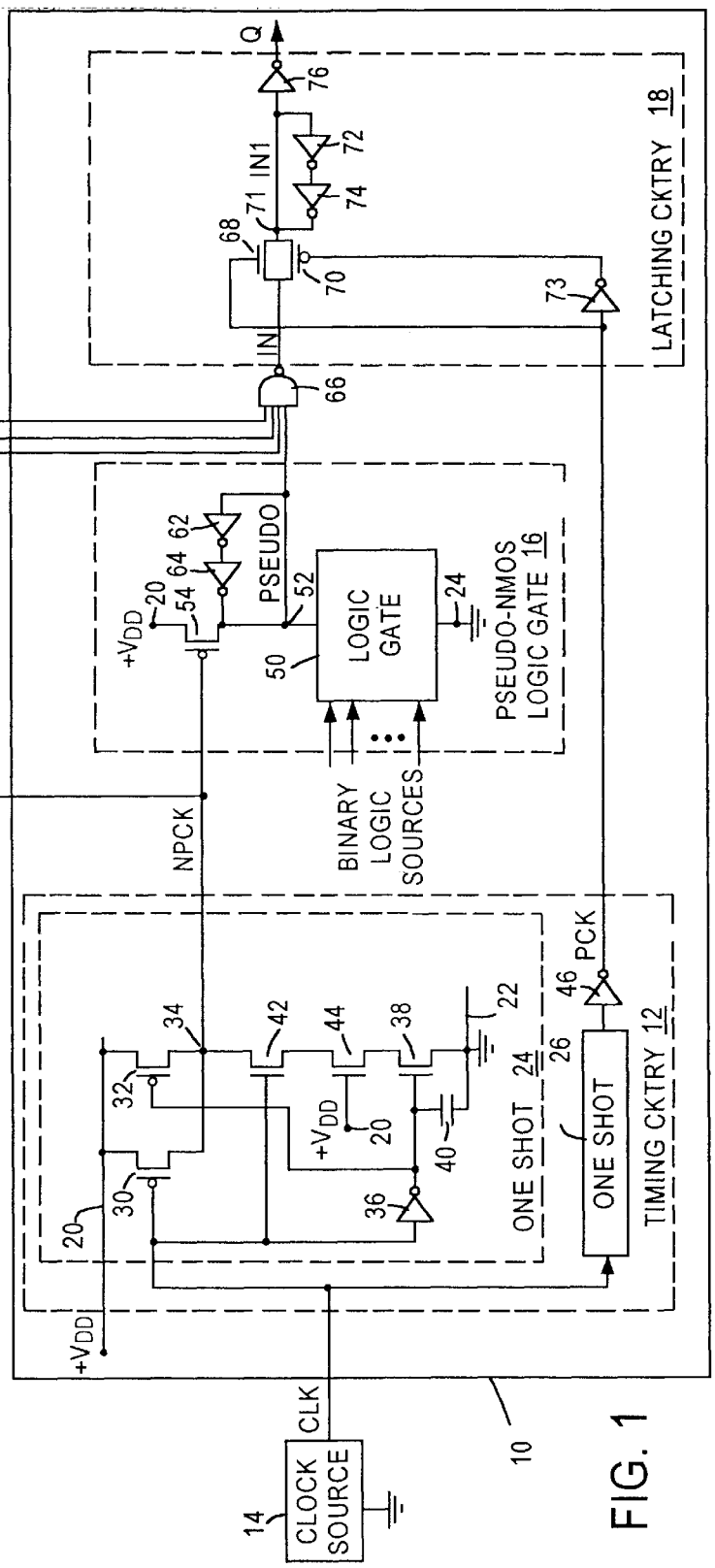
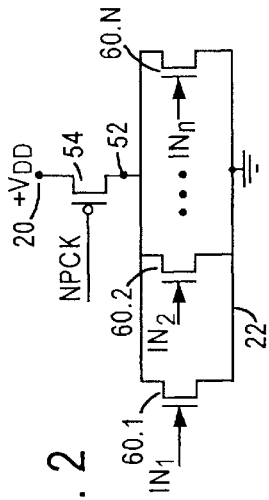
FIG. 2
FIG. 1

CONTENTION BASED LOGIC GATE DRIVING A LATCH AND DRIVEN BY PULSED CLOCK

TECHNICAL FIELD

The present invention relates generally to complementary metal oxide semiconductor (CMOS) integrated circuits of a type referred to as contention based logic gates and more particularly to such a logic gate that is driven by a pulsed clock source and has an output that is latched.

BACKGROUND ART

Classic CMOS logic circuits include N-channel pull-down circuitry and P-channel pull-up circuitry connected between ground and positive DC power supply terminals or rails of an integrated circuit chip. An output terminal between the N-channel and P-channel circuitry supplies circuitry downstream of the logic gate with a bi-level output signal, typically a voltage substantially at one of the rail voltages. The pull-up circuitry and pull-down circuitry are driven in parallel by binary input signals supplied to the logic gate. Usually, the pull-up circuitry includes multiple P-channel field effect transistors (FETs), while the pull-down circuitry includes N-channel FETs. In response to the logic function of the logic circuit being satisfied, the pull-up circuitry is activated to supply the voltage at the positive power supply terminal to the output terminal. If the logic function is not satisfied, the pull-down circuitry is activated to supply the low, typically ground power supply voltage to the output terminal. To provide these connections, the P-channel pull-up and N-channel pull-down circuitry include numerous elements. Such an arrangement requires significant space on the integrated circuit chip and complex components necessary to form the pull-up and pull-down circuits.

Contention based logic gates were developed to overcome the problems associated with the classic pull-up and pull-down circuit approach. Pseudo-NMOS logic gates are one type of contention based logic gates. A typical pseudo-NMOS logic gate includes a single P-channel FET connected between the positive rail and an output terminal and pull-down circuitry connected between the output terminal and ground rail. The P-channel field effect transistor connected between the positive rail and the output terminal has a gate electrode that is usually connected to ground, so that the P-channel FET is always biased on to a certain extent. If the logic function (which determines the configuration of the N-channel pull-down circuitry) is satisfied, the pull-down circuitry has a high impedance between the output terminal and the grounded rail so that the voltage at the positive DC power supply rail is coupled through the P-channel FET to the output terminal, causing the output terminal to be at a high voltage. If the logic function is not satisfied, the pull-down circuitry provides a low impedance between the output terminal and the grounded rail. The low impedance of the pull-down circuitry is considerably lower than the turn on impedance of the P-channel FET so that the output terminal is at a voltage substantially less than one-half of the voltage between the power supply rails, i.e., the voltage at the output terminal is lower than a threshold associated with circuits driven by the pseudo-NMOS logic gate.

A problem with the traditional pseudo-NMOS logic gate is that the P-channel FET is always biased on and is drawing current from the positive power supply rail. The power dissipation has deleterious effects on the device, particularly with regard to heat.

Clocked pseudo-NMOS logic gates were developed to limit the current flowing through the P-channel transistor connected between the gate output terminal and positive power supply rail during one phase, i.e., portion, of each clock cycle. In a typical clocked pseudo-NMOS logic gate, each clock cycle is divided into two approximately equal duration phases or portions (i.e., each cycle includes two approximately equal half cycles) so that during a first clock cycle phase, the clock wave is at a positive voltage level, i.e., binary one level, and during a second phase the clock wave has a low voltage (i.e., approximately ground) or binary zero level. Such a clock wave is applied to the P-channel FET so current flows through the P-channel FET only during approximately fifty percent of each clock wave cycle. Hence, the percentage of time power is dissipated in the P-channel FET is reduced by approximately fifty percent.

However, for many applications the fifty percent duty cycle of the P-channel FET of the clocked pseudo-NMOS logic gate is excessively high. Simply reducing the on time of the P-channel FET to a lower than fifty percent duty cycle does not, in many instances, permit downstream circuitry driven by the clocked pseudo-NMOS logic gate to adequately detect the result of the output signal of the logic gate, i.e., to detect whether the logic function of the gate has been satisfied by the input signals thereof. This is particularly the case for high frequency circuits having clock frequencies in the one GigaHertz range.

It is, accordingly, an object of the present invention to provide a new and improved contention based logic gate.

Another object of the present invention is to provide a new and improved contention based logic gate having a duty cycle substantially less than fifty percent and wherein circuitry driven by the gate can be responsive to the gate output, even though the gate is driven at very high frequencies, for example, in the one GigaHertz range or higher.

Another object of the invention is to provide a new and improved pseudo-NMOS gate having low power dissipation as a result of low duty cycle operation, wherein the gate can be responsive to a large number of input signals.

SUMMARY OF THE INVENTION

In accordance with one aspect of the invention, a logic circuit arrangement on an integrated circuit chip comprises a timing arrangement responsive to a clock pulse source for deriving a PSEUDO clock wave having an enable value interval that is substantially less than one-half a cycle of the clock wave. The PSEUDO clock wave causes a contention based logic gate to derive a logic level determined by binary inputs supplied to the logic gate and a predetermined logic function of the logic gate during the interval while the PSEUDO clock wave has the enable value. A latching circuit responds to the output of the contention based logic gate only during the interval when the PSEUDO clock wave, as coupled to the latching circuit, has the enable value. The latching circuit is activated only during at least some of the enable portion of the clock wave.

Another aspect of the invention concerns a method of operating a contention based logic gate on an integrated circuit chip having CMOS circuitry and responsive to a clock source. The method includes enabling: (1) the contention based logic gate to be responsive to logic input signals applied to it for a time interval that is substantially less than one-half a cycle of the clock source, and (2) a latching circuit to be responsive to an output signal derived by the logic gate only while the logic gate is enabled.

Enabling steps (1) and (2) are preferably performed by shaping a clock wave derived by the clock source into at least one PSEUDO clock wave having an enable interval substantially equal to the enable interval of the logic gate and latching circuit, and by applying the PSEUDO clock wave to the logic gate.

In the preferred embodiment, the clock wave is shaped into first and second PSEUDO clock waves. The applying step includes applying the first PSEUDO clock wave to the logic gate and applying the second PSEUDO clock wave to the latching circuitry. The first PSEUDO clock wave has an enable interval exceeding the enable interval of the second PSEUDO clock wave and the enable interval of the second PSEUDO clock wave occurs simultaneously with a portion of the enable duration of the first PSEUDO clock wave.

A further aspect of the invention relates to an integrated circuit chip having a logic circuit arrangement including: (1) a gate having an output terminal, (2) a first switch connected between the output terminal and a first DC power supply terminal, and (3) logic circuitry responsive to multiple binary input signals connected between the output terminal and a second DC power supply terminal. A latch circuit responds to a binary signal developed at the output terminal. A shaping circuit responds to the clock source for deriving a PSEUDO clock wave having an enable interval substantially less than one-half a cycle time of a clock source for the chip. The switch is connected to be responsive to the PSEUDO clock wave and is closed only during the interval while the PSEUDO clock wave has the enable value. The latch is arranged to be responsive to the signal at the output terminal only during an interval that occurs simultaneously with closure of the switch.

In a preferred embodiment, the contention based logic gate is a pseudo-NMOS logic gate and the latch circuit includes a pass gate connected to be responsive to a PSEUDO clock wave so that the pass gate supplies the latch with the signal at the output terminal only while the pass gate is open.

The switch preferably includes a field effect transistor having a source drain path connected between the first power supply terminal and the output terminal and a gate electrode connected to be responsive to the PSEUDO clock wave.

The shaping circuit preferably derives first and second PSEUDO clock waves. The first PSEUDO clock wave has an enable interval that exceeds the enable interval of the second PSEUDO clock wave. The enable interval of the second PSEUDO clock wave occurs simultaneously with a portion of the enable interval of the first PSEUDO clock wave. The first PSEUDO clock wave is applied to the gate electrode and the second PSEUDO clock wave is applied to the pass gate.

Preferably, a holding circuit maintains the voltage at the output terminal constant between adjacent enable intervals of the first PSEUDO clock wave and allows the voltage at the output terminal to change during the enable interval of the first PSEUDO clock wave.

The latch circuit preferably includes a holding circuit responsive to a signal passed by the pass gate. The holding circuit maintains the voltage passed by the pass gate constant during the interval between adjacent enable intervals of the second PSEUDO clock wave and is only changed during the enable intervals of the second PSEUDO clock wave.

In a preferred embodiment, the invention is used as an OR gate responsive to many (e.g., 64 or 132) input signals. In such a situation, several contention based logic gates, each having a NOR function associated therewith, drive a separate input of an NAND gate having a high fan-in.

The above and still further objects, features and advantages of the present invention will become apparent upon consideration of the following detailed descriptions of several specific embodiments thereof, especially when taken in conjunction with the accompanying drawings.

BRIEF DESCRIPTION OF THE DRAWINGS

FIG. 1 is a circuit diagram of a preferred embodiment of the present invention;

FIG. 2 is a circuit diagram of one exemplary pseudo-NMOS logic gate that can be employed in the circuit of FIG. 1;

DETAILED DESCRIPTION OF THE DRAWINGS

Figure 3:
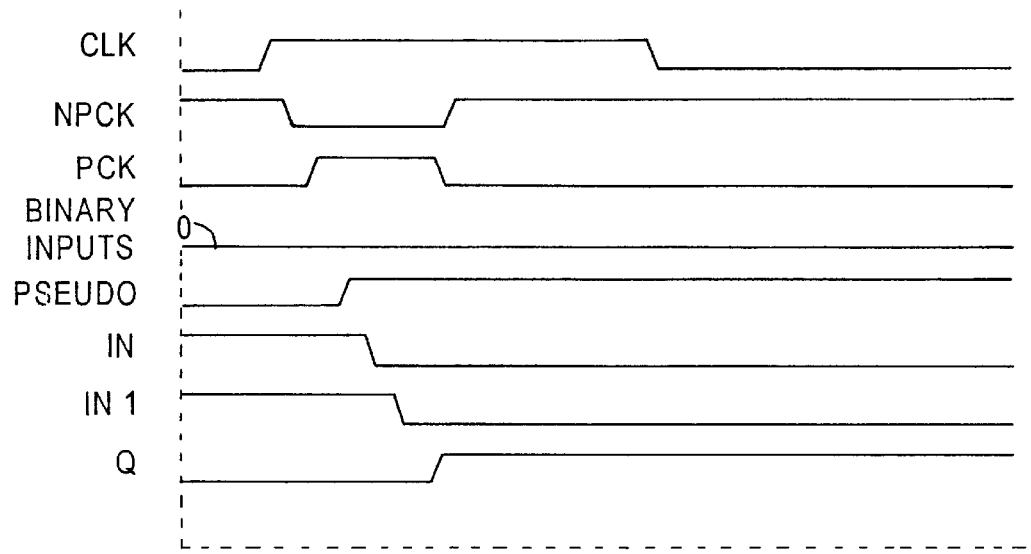
FIG. 3 includes a series of waveforms useful for describing the operation of the circuit of FIG. 1, based on the assumption that the logic function of the pseudo-NMOS gate is satisfied by input signals applied to the logic gate.

Reference is now made to FIG. 1 of the drawing wherein CMOS integrated circuit chip 10 including many field effect transistors (only the FETs necessary to describe the operation of a preferred embodiment of the invention are illustrated) includes timing circuitry 12 connected to be responsive to clock source 14, which derives clock wave CLK and may be internal or external to chip 10. Chip 10 also includes pseudo-NMOS logic gate 16, connected to be responsive to plural binary signals from sources (not shown) usually on chip 10, as well as NPCK clock wave that timing circuitry 12 derives. Gate 16 responds to the binary input signals and NPCK to derive a binary logic signal that drives latching circuitry 18, also responsive to a PCK clock wave from timing circuitry 12. Chip 10 also includes DC power supply terminals or rails 20 and 22, respectively connected to first and second DC power supply electrodes, typically having values of +1.3 volts (+$V_{DD}$) and ground, i.e., zero volts.

Clock source 14 has a relatively high frequency, such as 1.0 GHz and about a fifty percent duty cycle, such that during each cycle of clock source 14, the clock source supplies a square wave CLK to the chip, with the amplitude of the square wave being +$V_{DD}$ for about one-half of a clock source cycle time and ground during the remainder of each cycle of the clock source. Thus, for the 1.0 GHz frequency previously mentioned, each one nanosecond period of clock wave has about a 500 picosecond high voltage ($V_{DD}$) phase followed by about a 500 picosecond zero voltage phase. In this regard, the clock wave source 14 derives the waveform indicated by CLK, FIGS. 3 and 4.

Timing circuitry 12 includes two one-shots 24 and 26 driven in parallel by the CLK output of source 14. The circuit configurations of one-shots 24 and 26 are the same, the only difference being that the values of circuit components of the two one-shots differ so that the periods of the high and low phases the one-shots derive differ. Consequently, only one-shot 24 is described.

One-shot 24 includes P-channel field effect transistors 30 and 32 having the source electrodes thereof connected to positive DC power supply rail 20 and the drains thereof connected to the one-shot output terminal 34. One-shot 24 also includes inverter 36, as well as N-channel field effect transistors 38, 42 and 44 having the source drain paths thereof connected in series between the one-shot output terminal 34 and ground.

The CLK output of source 14 drives the gate electrode of FET 30, FET 42, and the input of inverter 36 in parallel. Inverter 36 and all other inverters in the described circuit have the usual configuration of a CMOS inverter, i.e., a pair of complementary field effect transistors having the source drain paths thereof series connected between rails 20 and 22. The two FETs of each inverter have the gate electrodes thereof connected in parallel to be driven by the inverter input and the drain electrodes thereof have a common terminal which is the inverter output terminal. Inverter 36 drives the gate electrodes of P-channel field effect transistor 32 and N-channel field effect transistor 38 in parallel. Transistor 38 has a much wider gate region than any other field effect transistor in one-shot 24, to establish a relatively large shunt parasitic capacitance between the source and gate electrodes of field effect transistor 38; this parasitic capacitance is illustrated by capacitor 40.

The CLK wave from source 14 drives the gate electrode of N-channel FET 42. A connection between the gate electrode of field effect transistor 44 and positive power supply terminal 20 permanently forward biases the source drain path of field effect transistor 44. However, no current flows through the source drain path of FET 44 except when FETs 38 and 42 are both forward biased. Forward biasing the gate electrodes of field effect transistors 38 and 42 and the permanent forward bias of FET 44 establish a low impedance path between the one-shot output terminal 34 and ground causing terminal 34 to be substantially at ground potential.

During the half cycle of the CLK wave while the CLK wave has a low, i.e., zero, voltage value, the CLK wave forward biases the gate of FET 30 and causes inverter 36 to derive a high, positive voltage binary one output level. The low CLK level and the high output of inverter 36 respectively back and forward bias the gate electrodes of field effect transistors 42 and 38 so that terminal 34 is isolated from ground, while being connected to positive power supply rail 20 through the low impedance source drain path of FET 30. Consequently, the voltage at terminal 34 is equal substantially to +$V_{DD}$. In response to a positive going transition of CLK, the source drain path of FET 30 turns off and the output voltage of inverter 36 begins to drop. However, because of the positive charge built up on capacitor 40 during the half cycle of source 14 while CLK was equal to zero, the output voltage of inverter 36 does not instantly drop to zero in response to the positive going transition of CLK. Consequently, FETs 32 and 38 respectively remain back and forward biased, so that terminal 34 is substantially at ground potential by virtue of terminal 34 being decoupled from positive rail 20 and being coupled to ground through the series connected low impedance source drain paths of FETs 38, 42 and 44, as indicated by the negative going transition of the NPCK wave of FIGS. 3 and 4.

Eventually, the voltage across capacitor 40 drops to a value which causes forward biasing of FET 32 and back biasing of FET 38. Such a voltage is reached after approximately twenty-five percent of one complete cycle of source 14 has elapsed, i.e., for the one GHz example, FETs 32 and 38 are respectively back biased and forward biased for about 250 picoseconds after the negative going leading edge transition of the waveform at terminal 34 occurs. In response to FET 32 being forward biased and FET 38 being back biased, terminal 34 is coupled to +$V_{DD}$ and decoupled from ground so that the voltage at terminal 34 returns substantially to the positive power supply rail potential. Consequently, the voltage at terminal 34 has a low, ground voltage for a period that is substantially less than one-half of a CLK cycle and a high, positive voltage for a period that is substantially greater than one-half of a CLK cycle.

One-shot 26 is constructed the same as one-shot 24 except that the width of the gate region of the FET in one-shot 26 which corresponds to FET 38 in one-shot 24 is appreciably less than the width of FET 38 in oneshot 24. Consequently, the value of the parasitic capacitance corresponding with capacitor 40 is lower in one-shot 26 than in one-shot 24. In addition, the field effect transistors of one-shot 26 which are directly responsive to the CLK positive going transition, i.e., the FETs of one-shot 26 corresponding with FETs 32 and 38 of one-shot 26, have somewhat wider and smaller gates respectively than the corresponding gates of one-shot 24. Consequently, the positive going transition at the output of one-shot 26 occurs slightly before the positive going transition at the output of one-shot 24.

Figure 4:
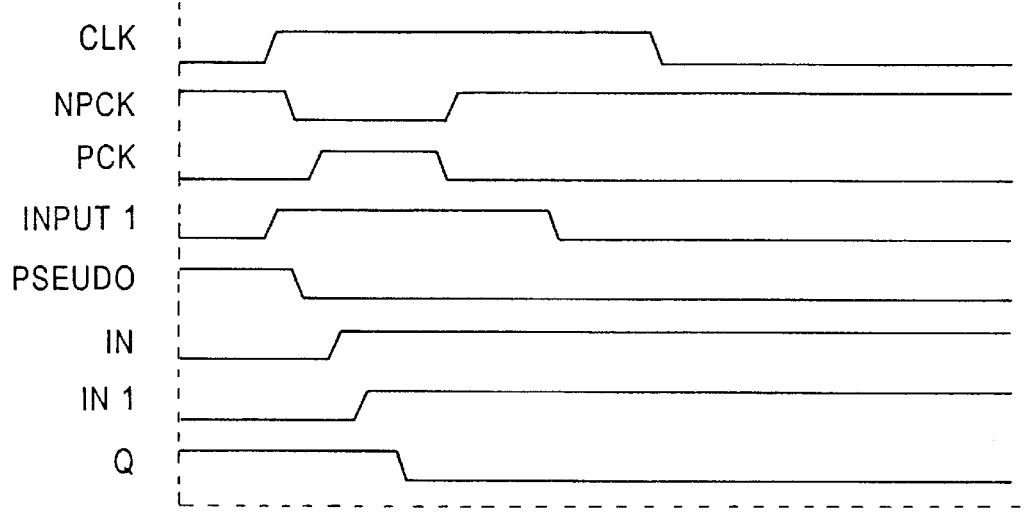
FIG. 4 includes a series of waveforms useful for describing the operation of the circuit of FIG. 1, based on the assumption that the logic, function of the logic gate is not satisfied.

The output of one-shot 26 drives an input terminal of inverter 46, having an output PCK, as illustrated in FIGS. 3 and 4. PCK has a (1) positive going transition that occurs somewhat after the negative going transition of NPCK and (2) a negative going transition that occurs somewhat before the positive going transition of NPCK. Consequently, the high voltage enable portion of PCK exists throughout the entire period of the low voltage enable portion of the NPCK. The NPCK and PCK output waves of timing circuit 12 bear their respective nomenclatures because they are PSEUDO clock waves, such that the positive going PCK leading edge transition occurs a few ps after the positive going CLK transition and the NPCK negative leading edge transition occurs between the positive going transitions of CLK and PCK. The NPCK positive going transition occurs about in the middle of the half high cycle of CLK and the PCK negative going transition occurs a few ps before the NPCK positive going transition.

Pseudo-NMOS logic gate 16 has the usual configuration including logic gate circuitry 50 connected between output terminal 52 of gate 16 and ground, in combination with P-channel FET 54 having its source drain path connected between terminal 52 and positive power supply rail 20. FET 54 includes a gate electrode connected to the output wave of one-shot 24. Consequently, P-channel FET 54 is on for only approximately twenty-five percent of each cycle of source 14, at the time the low voltage output of oneshot 24 forward biases FET 54; the voltage at terminal 52 has a meaningful value only during this time. If the logic function established by logic gate circuit 50 is satisfied during the interval while the low voltage output of one-shot 24 forward biases FET 54, terminal 52 is at a relatively low voltage. If, however, the logic function established by the circuitry of logic gate circuit 50 is not satisfied while the output of one-shot 24 forward biases FET 54, the logic gate has a high impedance between terminal 52 and ground, causing the voltage at terminal 52 to be equal substantially to +$V_{DD}$.

FIG. 2 is a circuit diagram of one configuration of pseudo-NMOS logic gate 16, wherein logic gate circuit 50 has a NOR gate configuration. The circuit of FIG. 2 is particularly designed to handle a situation in which many, for example, 16 or 32, N-channel FETs 60 are connected between terminal 52 and ground rail 22. The NOR gate of FIG. 2 includes multiple N-channel field effect transistors 60.1, 60.2 . . . 60.N, where N equals the number of input signals applied to logic gate circuit 50. The input signals are applied to the gate electrodes of FETs 60.1, 60.2 . . . 60.N. FETs 60.1, 60.2 . . . 60.N have source drain paths connected in parallel between terminal 52 and rail 22. If the voltage at the gate electrode of any of FETs 60.1, 60.2 . . . 60.N has a high, positive value signifying a binary one value, the corresponding FET is forward biased to couple the ground potential at rail 22 to output terminal 52; the voltage at terminal 52 is designated PSEUDO. If none of the input signals of the NOR gate of FIG. 2 is high, the voltage at terminal 52 is high when NPCK applies a forward bias voltage to the gate of FET 54 because the source drain path of FET 54 has a much lower impedance than the cut off parallel source drain paths of FETs 60.1, 60.2 . . . 60.N. The high PSEUDO voltage at terminal 52 signals that the logic function of the gate of FIG. 2 is not satisfied.

Inverters 62 and 64, cascaded with each other and connected in a regenerative feedback path with output terminal 52 of gate 16, form a "soft" latch or holding circuit for the voltage at terminal 52. During the portion of each cycle of the output of one-shot 24 when one-shot 24 has a high value (NPCK=1) that back biases FET 54, inverters 62 and 64 latch the voltage at terminal 52 to the value the voltage at terminal 52 had when one-shot 24 had a low value (NPCK=0) that forward biased FET 54. Hence, during the portion of a clock cycle when NPCK=1, the voltage at terminal 52 remains constant at the value it had during that same cycle when NPCK was equal to 0. For example, if the logic function of gate 50 was satisfied when NPCK was equal to 0 during a particular cycle, the flip-flop formed by inverters 62 and 64 holds the resulting low voltage at terminal 52 substantially constant during the interval of that particular clock cycle when NPCK=1.

A more important function of inverters 62 and 64 is to prevent terminal 52 from floating regardless of the impedance states of logic gate 50 and the source drain path of FET 54. Inverters 62 and 64 drive terminal 52 to ground or $+V_{DD}$ even if there is no low impedance path to ground terminal 24 through gate 50 or to terminal 20 through the source drain path of FET 54. If the voltage at terminal 52 were to float, the voltage driving circuitry downstream of terminal 52 could erroneously drift to a value associated with an incorrect binary value.

Another advantage of inverters 62 and 64 is that the inverters hold the voltage at terminal 52 at the correct value if there is a slight mis-synchronization in the trailing, positive going edge of NPCK and the trailing negative going edge of PCK. As described, the high portion of PCK enables the voltage at terminal 52 to propagate to downstream latch 18 and the low portion of NPCK causes evaluation of the state of logic gate 50. Ideally, the high and low portions of PCK and NPCK occur simultaneously or the high portion of PCK is completed before completion of the low portion of NPCK. However, the PCK and NPCK voltages do not always arrive at the loads thereof in this ideal order; sometimes the trailing negative going edge of PCK arrives at its load in latch 18 slightly after (a few ps) the trailing positive going edge of NPCK turns off FET 54. If such mis-synchronization occurs, inverters 62 and 64 hold the voltage at terminal 52 at the correct value.

Inverters 62 and 64 maintain the PSEUDO voltage at terminal 52 at the high or low value until a few picoseconds after the next positive going transition of CLK.

The PSEUDO voltage at terminal 52 drives NAND gate 66 by virtue of a connection from terminal 52 to one input of the NAND gate which has four input signal terminals. NAND gate 66 can supply substantially greater current to its output terminal than the inverters of FIG. 1.

The other inputs of NAND gate 66 are from other pseudo-NMOS logic gates 67, 68 and 69 similar to pseudo-NMOS logic gate 16 that derives the PSEUDO output. Each of pseudo-NMOS logic gates 67, 68 and 69 has an input responsive to the NPCK output of one-shot 24 and an output driving one input of NAND gate 66. The pseudo-NMOS logic gates 67, 68 and 69 usually respond to binary logic sources different from the sources that drive logic gate 50 of gate 16 and can have logic functions different from the logic function of gate 50. NAND gate 66 is highly advantageous if logic gate 50 of gate 16 and the corresponding pseudo-NMOS logic gates 67–69 are NOR gates, because a low binary zero output voltage of NAND gate 66 in such a situation indicates the presence of a binary one at the input of any of the NOR gates. In such a situation, the combination of pseudo-NMOS logic gates 16, 67, 68 and 69 and NAND gate 66, which can handle the high fan-in requirements of gates 16, 67, 68 and 69, is an OR gate having 64 or 132 inputs.

NAND gate 66 has an output which has the same shape that PSEUDO waveform gate 16 derives when the remaining inputs of gate 66 have a high positive voltage indicative of the logic functions of logic gates 67, 68 and 69 being satisfied. The output voltage (IN) of NAND gate 66 is an inverted and slightly delayed replica of PSEUDO. The delay is introduced by circuitry within gate 66.

The output signal of NAND gate 66 drives a bilateral pass gate including N-channel FET 68 and P-channel FET 70 by virtue of connections between the inverter output and the source electrodes of FETs 68 and 70. The drain electrodes of FETs 68 and 70 are tied to each other and to line or lead 71 where signal IN1 (FIGS. 3 and 4) is derived. The gate electrodes of FETs 68 and 70 respectively respond to the PCK output of inverter 46 of timing circuitry 12 and an inverted replica thereof, which inverter 73 derives. Consequently, the pass gate FETs 68 and 70 form is open during the approximately fifteen per cent of each clock cycle time while PCK has a high value, enabling the IN1 voltage at the drains of FETs 68 and 70 to be driven high or low during the approximately fifteen per cent of each cycle time of CLK while PCK has a high value.

Cascaded inverters 72 and 74, connected in a regenerative, feedback arrangement with the drains of FETs 68 and 70, maintain the voltage at the drains of FETs 68 and 70 constant after the pass gate formed by FETs 68 and 70 has turned off. Consequently, the voltage on line 71 has a transition shortly after a transition of IN; the delay in the IN1 transition occurs because of the inherent delay time of FETs 68 and 70 in passing the IN output of NAND gate 66 to lead 71.

Inverter 76 has an input connected to lead 71 and derives an output Q which has a transition shortly after a transition of IN1 on lead 71. The transition of Q at the output of inverter 76 occurs slightly after the IN1 transition because of the inherent delay time of inverter 76.

A high (positive) output voltage of inverter 76 indicates the logic function of gate circuit 50 was satisfied by the input signals of the logic gate circuit, i.e., that the input signals of all of FETs 60.1, 60.2 . . . 60.N were at the low level throughout the time that one-shot 24 had a low voltage to forward bias FET 54.

In the example of FIG. 3 all the inputs at the gate electrodes of FETs 60.1, 60.2 . . . 60.N are assumed to be at zero voltage as indicated by the constant zero value of BINARY INPUTS. Hence, the voltage at terminal 52, indicated by waveform PSEUDO, goes high a few ps after the NPCK output of one-shot 24 goes low and the PSEUDO voltage at terminal 52 stays high for the remainder of the CLK cycle. The PSEUDO waveform remains high until at least a few picoseconds after the next positive going transition of CLK by virtue of the latching action of the flip-flop formed by back to back inverters 62 and 64 or until BINARY INPUTS satisfies the logic function of gate 50 to pull terminal 52 to a low voltage.

The operation of the circuit of FIG. 1 differs from that indicated by FIG. 3 when the input signals of logic gate circuit 50 do not satisfy the circuit logic function. Such operation is illustrated in FIG. 4 wherein INPUT 1 at the gate electrode of FET 60.1 has a low to high transition before the negative going leading edge transition of NPCK at the output of one-shot 24 and the positive going leading edge transition of PCK at the output of inverter 46. In the example of FIG. 4, the signals at the gate electrodes of FETs 60.2 . . . 60.N all remain at zero.

Under the stated situation of FIG. 4, INPUT 1 at the gate electrode of FET 60.1 causes a low impedance path to be established between output terminal 52 of pseudo-NMOS logic gate 16 and ground rail 22. The low impedance established between terminal 52 and ground rail 22 through the source drain path of FET 60.1, however, is low enough to overcome the holding effect or soft latch of inverters 62 and 64 so that the PSEUDO voltage at terminal 52 goes to a low voltage. In FIG. 4 it is assumed that the voltage at terminal 52 had a high value during the previous CLK cycle. The PSEUDO high to low transition occurs a few ps after the low to high transition of INPUT 1 because of the delay effects of FET 60.1. Terminal 52 remains at a low voltage by virtue of the holding effect of inverters 62 and 64 and INPUT 1 being high at least until the next NPCK high to low transition.

Inverter 66 responds to PSEUDO to derive signal IN, having a positive going transition occurring slightly after the negative going transition of PSEUDO. The PCK output signal of inverter 46 opens the pass gate including FETs 68 and 70 while NAND gate 66 is deriving the IN low to high transition. Consequently, IN1 has a low to high transition shortly after the IN low to high transition. Because of the holding action of inverters 72 and 74 IN remains at the high level at least until the next time PCK has a low to high transition. This acts as a cycle based pulse latch having an input responsive to the output of pseudo gate 16 as derived by NAND gate 66.

Inverter 76 responds to waveform IN1 to produce waveform Q, having a high to low transition slightly after the low to high transition of IN1. The Q output waveform of inverter 76 remains at the low voltage value at least until the next occurrence of the low to high transition of CLK. The low output voltage of inverter 76 for the situation of FIG. 4 indicates the logic function of gate 50 was not satisfied, i.e., that at least one of the input signals of FETs 60.1, 60.2 . . . 60.N had a binary one value.

While there have been described and illustrated specific embodiments of the invention, it will be clear that variations in the details of the embodiments specifically illustrated and described may be made without departing from the true spirit and scope of the invention as defined in the appended claims. For example, other types of circuitry can be used to derive NPCK and PCK and logic functions other than the NOR function can be used in the logic gates of the pseudo-NMOS logic gates. In one arrangement, a one-shot responsive to CLK and an inverter responsive to the one-shot can derive PCK and NPCK. The pseudo-NMOS logic gate is only one type of contention based logic gate that can be employed. Another exemplary contention based logic gate that could be used includes first and second P-type FETs having series connected source drain paths connected between a positive DC power supply terminal and a terminal, similar to terminal 52, of a logic gate including N-type FETs. The source drain paths of the N-type FETs are switched on to provide a low impedance path to a ground terminal when the logic function associated with the logic gate is satisfied. NPCK pulses at the gate of the first P-type FET turns on the source drain path of the first FET during the clock evaluate phase. A ground voltage at the gate of the second P-type FET biases FET into an on condition.

We claim:

1. A logic circuit arrangement on an integrated circuit chip adapted to be responsive to a clock pulse source comprising
   a timing arrangement connected to be responsive to the clock pulse source for deriving at least one PSEUDO clock wave having an enable value during an interval that is substantially less than one-half a cycle of the clock wave,
   a contention based logic gate responsive to one of the PSEUDO clock waves so that the contention based logic gate derives a logic level determined by binary inputs supplied to the contention based logic gate and a predetermined logic function of the contention based logic gate during the interval while the PSEUDO clock has the enable value, and
   a latching circuit responsive to the output signal of the contention based logic gate and one of the PSEUDO clock waves, the latching circuit being arranged so that it is responsive to the output of the contention based logic gate only during the enable period of the PSEUDO clock wave as coupled to the latching circuit, the latching circuit being activated only during at least some of the enable portion of the clock wave the timing arrangement applies to the contention based logic gate.

2. The circuit of claim 1 wherein the contention based logic gate is a pseudo NMOS logic gate.

3. A method of operating a contention based logic gate on an integrated circuit chip having CMOS circuitry and responsive to a clock source comprising the steps of enabling the contention based logic gate to be responsive to logic input signals applied to it for a time interval that is substantially less than one-half of a cycle of the clock source, and enabling a latch to be responsive to an output signal derived by the contention based logic gate only while the contention based logic gate is enabled.

4. The method of claim 3 wherein the enabling steps are performed by shaping a clock wave derived by the clock source into at least one PSEUDO clock wave having an enable period substantially equal to the enable time of the contention based logic gate and latch, and applying at least one PSEUDO clock wave to the contention based logic gate and the latch.

5. The method of claim 3 wherein the latch is enabled for a time interval less than the enable time interval of the contention based logic gate.

6. The method of claim 3 wherein the clock has a frequency on the order of one GHz or higher.

7. The method of claim 3 wherein the contention based logic gate is a pseudo NMOS logic gate.

8. A method of operating a contention based logic gate on an integrated circuit chip having CMOS circuitry and responsive to a clock source comprising the steps of enabling the contention based logic gate to be responsive to logic input signals applied to it for a time interval that is substantially less than one-half of a cycle of the clock source, and enabling a latch to be responsive to an output signal derived by the contention based logic gate only while the contention based logic gate is enabled, the enabling steps being performed by shaping a clock wave derived by the clock source into at least one PSEUDO clock wave having an enable period substantially equal to the enable time of the contention based logic gate and latch, and applying at least one PSEUDO clock wave to the contention based logic gate and the latch, the clock being shaped into first and second PSEUDO clock waves, the applying step including applying the first PSEUDO clock wave to the contention based logic gate and applying the second PSEUDO clock wave to the latch, wherein the first PSEUDO clock wave has an enable duration exceeding the enable duration of the second PSEUDO clock wave and the enable duration of the second PSEUDO clock wave occurs simultaneously with the enable duration of the first PSEUDO clock wave.

9. A logic circuit arrangement on an integrated circuit chip adapted to be responsive to a clock source, the chip having first and second DC power supply terminals comprising a gate having (a) an output terminal, (b) a switch connected between the output terminal and the first DC power supply terminal and (c) logic circuitry connected to be responsive to multiple binary input signals, the logic circuitry being connected between the output terminal and the second DC power supply terminal, a latch circuit connected to be responsive to a binary signal developed at the output terminal, and a shaping circuit connected to be responsive to the clock source for deriving at least one PSEUDO clock wave having an enable period substantially less than one-half cycle time of the clock source, the switch being connected to be responsive to the PSEUDO clock wave and being closed only during the enable period thereof, the latch being arranged to be responsive to the signal at the output terminal only during an interval that occurs while the switch is closed.

10. The arrangement of claim 9 further including a pass gate connected to be responsive to one of PSEUDO clock waves, the latch circuit and pass gate being connected so that the pass gate supplies the latch with the signal at the output terminal only while the pass gate is open.

11. The arrangement of claim 10 wherein the switch includes a field effect transistor having (a) a source drain path connected between the first power supply terminal and the output terminal and (b) a gate electrode connected to be responsive to the PSEUDO clock waves.

12. The arrangement of claim 9 wherein the switch includes a field effect transistor having a (a) source drain path connected between the first power supply terminal and the output terminal and (b) a gate electrode connected to be responsive to the PSEUDO clock wave.

13. The arrangement of claim 9 further including a holding circuit for the voltage at the output terminal, the holding circuit being arranged so that the voltage at the output terminal remains held between adjacent enable periods of the clock wave and which enables the voltage at the output terminal to change during the enable period of the PSEUDO clock wave.

14. The arrangement of claim 13 wherein the holding circuit is arranged for preventing floating of the output terminal to drive the output terminal substantially to the voltages at the power supply terminals.

15. The arrangement of claim 9 wherein the logic circuitry has a NOR function and is responsive to multiple binary input signals, a plurality of said gates each having a NOR function, and a NAND gate having a plurality of inputs, each responsive to a different one of said gates, the NAND gate having an output terminal connected to drive the latch circuit.

16. The arrangement of claim 9 wherein the shaping circuit comprises a one-shot.

17. The arrangement of claim 9 wherein the contention based logic gate is a pseudo NMOS logic gate.

18. A logic circuit arrangement on an integrated circuit chip adapted to be responsive to a clock source, the chip having first and second DC power supply terminals comprising a gate having (a) an output terminal, (b) a switch connected between the output terminal and the first DC power supply terminal and (c) logic circuitry connected to be responsive to multiple binary input signals, the logic circuitry being connected between the output terminal and the second DC power supply terminal, a latch circuit connected to be responsive to a binary signal developed at the output terminal, and a shaping circuit connected to be responsive to the clock source for deriving at least one PSEUDO clock wave having an enable period substantially less than one-half cycle time of the clock source, the switch being connected to be responsive to the PSEUDO clock wave and being closed only during the enable period thereof, the latch being arranged to be responsive to the signal at the output terminal only during an interval that occurs while the switch is closed, a pass gate connected to be responsive to one of PSEUDO clock waves, the latch circuit and pass gate being connected so that the pass gate supplies the latch with the signal at the output terminal only while the pass gate is open, wherein the switch includes a field effect transistor having (a) a source drain path connected between the first power supply terminal and the output terminal and (b) a gate electrode connected to be responsive to the PSEUDO clock waves, the shaping circuit being arranged for deriving first and second PSEUDO clock waves, the first PSEUDO clock wave having an enable period that exceeds the enable period of the second PSEUDO clock wave, the enable period of the second PSEUDO clock wave occurring simultaneously with the enable period of the first PSEUDO clock wave, the first PSEUDO clock wave being applied to the gate electrode, the second PSEUDO clock wave being applied to the pass gate.

19. The arrangement of claim 18 further including a holding circuit for the voltage at the output terminal, the holding circuit being arranged so that the voltage at the output terminal (a) remains held between adjacent enable periods of the first PSEUDO clock wave and (b) can change only during the enable period of the enable period of the first PSEUDO clock wave.

20. The arrangement of claim 19 wherein the holding circuit includes first and second cascaded inverters, an input terminal of the first inverter being connected to be responsive to the voltage at the output terminal, and the second inverter being connected to an output voltage thereof to the output terminal.

21. The arrangement of claim 20 wherein the latch circuit includes a holding circuit connected to be responsive to a signal passed by the pass gate, the holding circuit being arranged (a) to maintain the voltage passed by the pass gate constant during the interval between adjacent enable periods of the second PSEUDO clock wave and (b) so the voltage at the output of the pass gate can change only during the enable periods of the second PSEUDO clock wave.

22. A method of operating a contention based logic gate on an integrated circuit chip having CMOS circuitry and responsive to a clock source comprising the steps of enabling the contention based logic gate to be responsive to logic input signals applied to it for a time interval that is substantially less than one-half of a cycle of the clock source, and enabling a latch to be responsive to any output signal derived by the contention based logic gate only while the contention based logic gate is enabled, the enable duration of the contention based logic gate being greater than the period the latch is responsive to the output signal derived by the contention based logic gate.

23. A logic circuit arrangement on an integrated circuit chip adapted to be responsive to a clock source, the chip having first and second DC power supply terminals, the circuit arrangement comprising a gate having (a) an output terminal, (b) a switch connected between the output terminal and the first DC power supply terminal and (c) logic circuitry connected to be responsive to multiple binary input signals, the logic circuitry being connected between the output terminal and the second DC power supply terminal, a latch circuit connected to be responsive to a binary signal developed at the output terminal, and a shaping circuit connected to be responsive to the clock source for deriving first and second PSEUDO clock waves both having an enable period substantially less than one-half cycle time of the clock source, the first PSEUDO clock wave having an enable period that exceeds the enable period of the second PSEUDO clock wave, the enable period of the second PSEUDO clock wave occurring simultaneously with the enable period of the first PSEUDO clock wave, the switch being connected to be responsive to the first PSEUDO clock wave and being closed only during the enable period thereof, the latch being arranged to be responsive to the signal at the output terminal only during an interval that occurs while the switch is closed and during the enable period of the PSEUDO clock wave.

24. A logic circuit arrangement on an integrated circuit chip adapted to be responsive to a clock pulse source comprising a timing arrangement connected to be responsive to the clock pulse source for deriving first and second PSEUDO clock waves both having an enable value during an interval that is substantially less than one-half a cycle of the clock wave, the first PSEUDO clock wave having an enable period that exceeds the enable period of the second PSEUDO clock wave, the enable period of the second PSEUDO clock wave occurring simultaneously with the enable period of the first PSEUDO clock wave, a contention based logic gate connected to be responsive to the first PSEUDO clock wave so that the contention based logic gate derives a logic level determined by binary inputs supplied to the contention based logic gate and a predetermined logic function of the contention based logic gate during the interval while the first PSEUDO clock has the enable value, and a latching circuit connected to be responsive to the output signal of the contention based logic gate and the second PSEUDO clock wave, the latching circuit being arranged so that it is responsive to the output of the contention based logic gate only during the enable period of the second PSEUDO clock wave as coupled to the latching circuit, the latching circuit being activated only during the enable portion of the second PSEUDO clock wave.

* * * * *